United States Patent
Lee et al.

(10) Patent No.: US 7,019,977 B2
(45) Date of Patent: Mar. 28, 2006

(54) METHOD OF ATTACHING NON-ADHESIVE THERMAL INTERFACE MATERIALS

(75) Inventors: Seri Lee, Beaverton, OR (US); Seung M. You, Seoul (KR); Jae W. Chang, Seoul (KR)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 10/740,956

(22) Filed: Dec. 17, 2003

(65) Prior Publication Data

US 2005/0135066 A1 Jun. 23, 2005

(51) Int. Cl.
*H05K 7/20* (2006.01)

(52) U.S. Cl. .................. 361/704; 361/707; 257/706; 257/712; 165/80.3; 165/185

(58) Field of Classification Search ............... 361/704, 361/705, 707; 257/706, 707, 712, 717; 165/80.3, 165/185; 174/16.1, 16.3
See application file for complete search history.

(56) References Cited

U.S. PATENT DOCUMENTS

| | | | | |
|---|---|---|---|---|
| 5,745,344 A | * | 4/1998 | Baska et al. | 361/705 |
| 5,905,636 A | * | 5/1999 | Baska et al. | 361/705 |
| 5,931,222 A | * | 8/1999 | Toy et al. | 165/80.3 |
| 6,008,536 A | * | 12/1999 | Mertol | 257/704 |
| 6,097,602 A | | 8/2000 | Witchger | |
| 6,261,404 B1 | * | 7/2001 | Baska et al. | 156/310 |
| 6,315,038 B1 | * | 11/2001 | Chiu | 165/185 |
| 6,317,326 B1 | * | 11/2001 | Vogel et al. | 361/704 |
| 6,462,410 B1 | * | 10/2002 | Novotny et al. | 257/707 |

FOREIGN PATENT DOCUMENTS

| | | |
|---|---|---|
| WO | WO-0058683 A1 | 10/2000 |
| WO | WO-05062688 A1 | 7/2005 |

* cited by examiner

*Primary Examiner*—Boris Chérvinsky
(74) *Attorney, Agent, or Firm*—Schwegman, Lundberg, Woessner & Kluth, P.A.

(57) ABSTRACT

Securing a heat sink to an electronic device, such as an integrated circuit package, includes applying an adhesive layer to only a periphery of a surface on a thermal interface material. The thermal interface material is applied to the heat sink and/or integrated circuit package using the adhesive layer. The heat sink is in thermal contact with the integrated circuit package to extract heat during operation.

19 Claims, 3 Drawing Sheets

METHOD OF ATTACHING NON-ADHESIVE THERMAL INTERFACE MATERIALS

TECHNICAL FIELD

Embodiments of the present invention address heat transfer in electronic devices, and in particular relates to a method of attaching a non-adhesive thermal interface material between a heat sink and an integrated circuit package.

BACKGROUND

Electronic devices generate heat during operation. Thermal management refers to the ability to keep temperature-sensitive elements in an electronic device within a prescribed operating temperature.

The development of high performance electronic devices now requires more innovative thermal management. Each increase in speed and power generally carries a cost of increased heat generation such that additional innovations must be made to provide proper thermal management.

Several methods have been employed for cooling electronic devices that include high performance integrated circuits. As shown in FIG. 1, one method of cooling these types of integrated circuits is by attaching a heat sink 10 to a heat spreader 12 that is part of an integrated circuit package 14. Integrated circuit package 14 is typically soldered, or plugged into, a motherboard on a computer. The heat sink 10 provides cooling to the integrated circuit package 14 during operation of a computer system that includes integrated circuit package 14.

A thermal interface material 16 is most often used to promote an effective thermal path between integrated heat spreader 12 and heat sink 10. Thermal interface material 16 is typically in the form of a paste or tape.

New thermal interface materials with higher thermal conductivities are continually being developed to meet the requirements for more efficient heat removal. These improvements are necessary to keep the next generation of processors operating at acceptable temperatures. Some of the new thermal interface materials are phase-change materials that provide higher thermal performance. These new materials have been proven to be thermally superior over other types of thermal interface materials.

Some of the new thermal interface materials are inherently sticky and adhere well to a surface on heat sink 10 and/or heat spreader 12 with no special treatment or preparation. Sticky thermal interface materials simplify fabrication of an electronic device that includes integrated circuit package 14 because a sticky thermal interface material 16 is easily attached to heat sink 10. Therefore, heat sink suppliers can easily attach sticky thermal interface materials to heat sinks as one of the last steps in the heat sink fabrication process. Heat sinks with pre-attached thermal interface materials allow heat sink suppliers and electronic device manufacturers to handle the combination as one part.

Many of the highly desirable thermal interface materials do not adhere to a surface. As shown in FIG. 2, suppliers of non-sticky thermal interface materials often spray or overlay an adhesive layer 18 onto an entire surface of thermal interface material 16. Adhesive layer 18 connects one of the entire surfaces of thermal interface material 16 to heat sink 10.

Adhesive layer 18 has a much lower thermal conductivity than thermal interface material 16, so that adhesive layer 18 adversely effects the thermal performance of thermal interface material 16. The poor thermal performance of adhesive layer 18 was acceptable in the past because the magnitude of the thermal penalty introduced by adding adhesive layer 18 was relatively small as compared to the overall thermal resistance of thermal interface material 16. As high performance thermal interface materials have been developed, the additional resistance introduced by applying adhesive layer 18 has become a major portion of the overall thermal resistance between integrated circuit package 14 and heat sink 10.

Therefore, it would be desirable to be able to adhere a non-sticky thermal interface material to a heat sink and/or an integrated circuit package without sacrificing thermal conductivity between the integrated circuit package and the heat sink. Any improvements in assembling non-sticky thermal interface materials to heat sinks and/or integrated circuit packages would also not significantly increase the cost of fabricating electronic devices.

DETAILED DESCRIPTION

Figure 1:
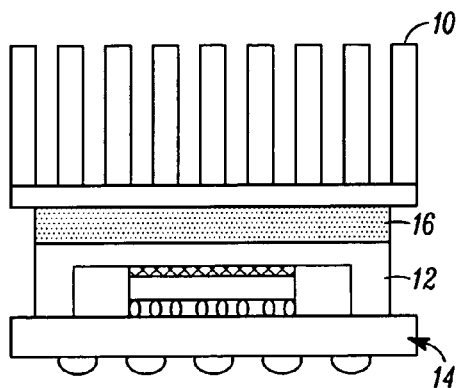
FIG. 1 is a schematic side view illustrating a prior art heat sink assembly.
Figure 2:
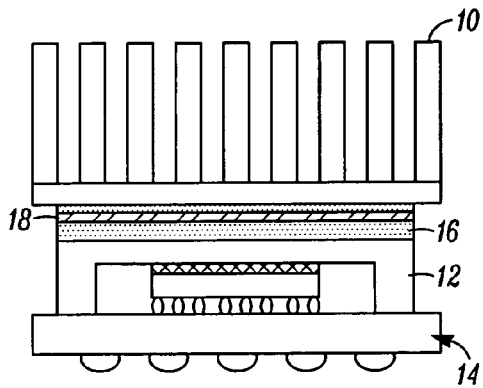
FIG. 2 is schematic side view similar to FIG. 1 illustrating another prior art heat sink assembly.

In the following detailed description of the invention reference is made to the accompanying drawings that show specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made without departing from the scope of the present invention.

Figure 3:
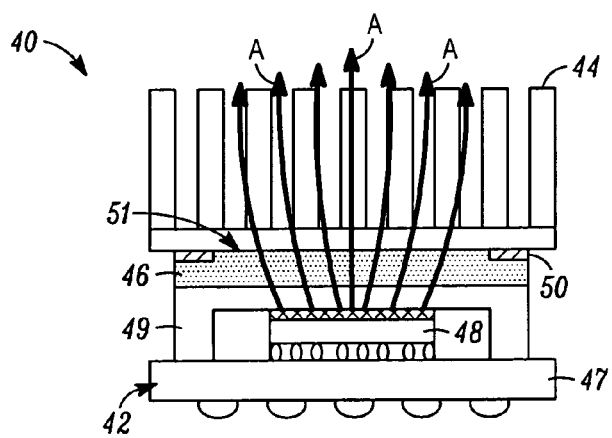
FIG. 3 is a schematic side view illustrating one embodiment of an electronic assembly that encompasses the present invention.

FIG. 3 illustrates an example embodiment of an electronic assembly 40 that encompasses the present invention. Electronic assembly 40 includes an integrated circuit package 42 that is thermally connected to a heat sink 44 by a thermal interface material 46. Heat sink 44 thermally conducts heat away from integrated circuit package 42 in order to cool integrated circuit package 42 as integrated circuit package 42 generates heat during operation.

In the illustrated example embodiment, integrated circuit package 42 includes a substrate 47 and a die 48 mounted to a substrate 47. Integrated circuit package 42 further includes a heat spreader 49 that conducts heat from die 48 to heat sink 44.

Figure 4:
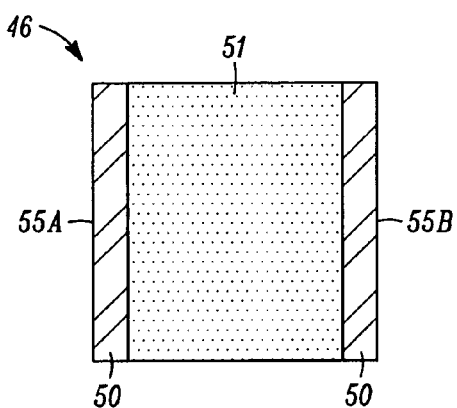
FIG. 4 is a top plan illustrating the thermal interface material in the electronic assembly shown in FIG. 3.

Referring now also to FIG. 4, adhesive layer 50 is applied only on a periphery of a surface 51 on thermal interface material 46. Adhesive layer 50 is aligned with opposing edges 55A, 55B on surface 51. The thickness of adhesive layer 50 and the degree to which adhesive layer 50 extends over surface 51 depends on the type of adhesive, thermal interface material 46, heat sink 44 and spreader 49.

Positioning adhesive layer 50 on a periphery of thermal interface material 46 permits a non-adhesive thermal interface material to be connected to either heat sink 44 or spreader 49 while maintaining the high thermal performance of the thermal interface material 46. As indicated by arrows A in FIG. 3, when heat flows between heat spreader 49 and heat sink 44, almost all of the heat is transferred through an effective thermal area that extends outward from the center of the thermal connection. Therefore, adhesive layer 50 can be applied over only the periphery of thermal interface material 46 without significantly altering the heat transfer path. Since there is little or no change to the heat transfer path, adding adhesive layer 50 has little effect on the thermal performance of thermal interface material 46.

Thermal interface material 46 can also be pre-assembled to heat sink 44 to form a heat sink assembly that has a one-piece configuration with heat sink 44. A heat sink assembly that combines thermal interface material 46 with heat sink 44 simplifies shipping and fabrication of an electronic assembly that includes the heat sink assembly.

Figure 5:
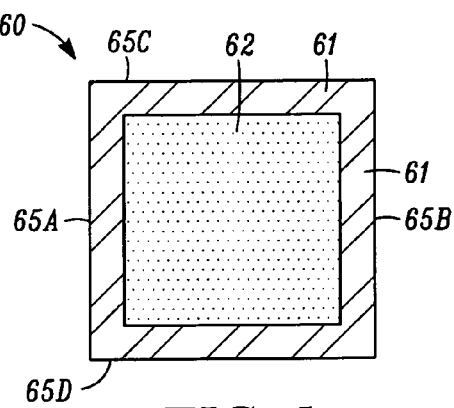
FIG. 5 is a top plan similar to FIG. 4 illustrating another form of the thermal interface material.

FIG. 5 shows an alternative thermal interface material 60 that may be used in electronic assembly 40. An adhesive layer 61 is aligned with each edge 65A, 65B, 65C, 65D of thermal interface material 60 on a surface 62 of thermal interface material 60. It should be noted that adhesive layer 61 may be aligned with only one edge 65A, 65B, 65C, 65D of thermal interface material.

The adhesive layer may be aligned with one, or any combination, of the edges on the thermal interface material. In addition, the adhesive layer does not have to be aligned with an edge of the thermal interface material as long as the adhesive covers enough of the surface to hold the heat sink under foreseen environmental conditions on a surface of the thermal interface material.

Figure 8:
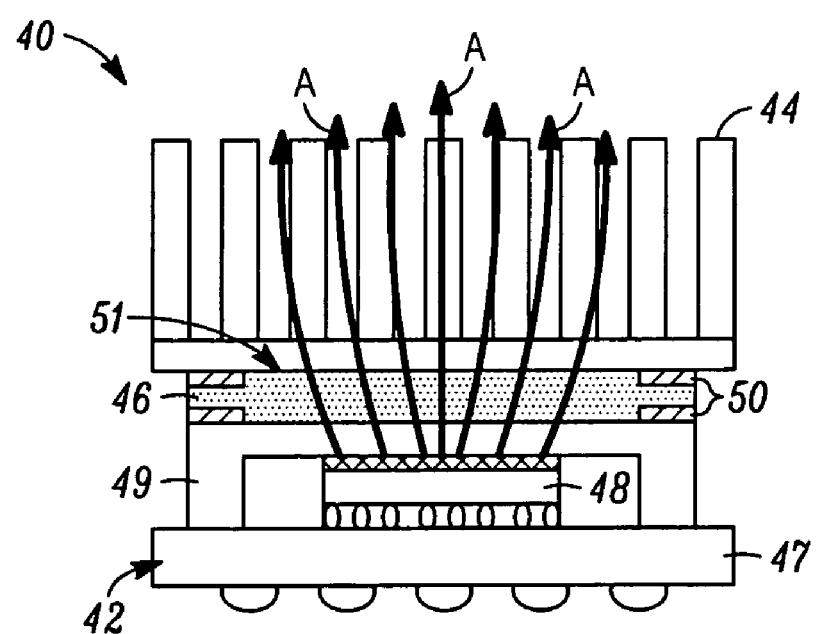
FIG. 8 is a schematic side view illustrating yet another embodiment of an electronic assembly that encompasses the present invention.

It should be noted that although the illustrated adhesive layers are on one surface of the thermal interface material, an adhesive layer may be applied on both surfaces of the thermal interface material (see, e.g., FIG. 8). Depending on whether adhesive is mounted to one or both sides of the thermal interface material, the thermal interface material may be secured to either the integrated circuit package and/or the heat sink before, or as, the heat sink is assembled to the integrated circuit package. The thermal interface material may have any shape and is not limited to the square shape shown in FIGS. 4 and 5.

In some embodiments, the thickness of the thermal interface material depends on the type of thermal interface material. Thermal interface material 46 may change phases from a solid to a liquid during the initial operation of die 48 as the temperature of heat sink 44 and heat spreader 49 rises above a certain level. When die 48 is no longer operating, thermal interface material 46 changes back into a solid to further bond heat sink 44 to integrated circuit package 42. The bond reduces the thermal impedance between the heat sink 44 and the integrated circuit package 42 over the life of the electronic assembly 40.

Figure 6:
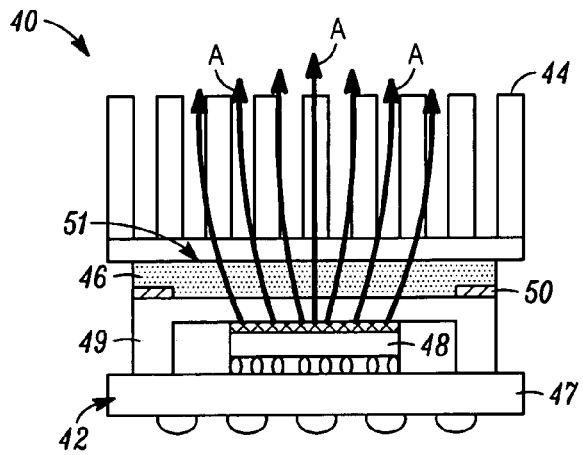
FIG. 6 is a schematic side view similar to FIG. 3 illustrating another example embodiment of an electronic assembly encompassing the present invention.

Another example embodiment is directed to a method of securing a heat sink to an electronic device such as integrated circuit package 42. The method includes applying an adhesive layer 50 to only a periphery of a surface 51 on a thermal interface material 46. Thermal interface material 46 is applied to heat sink 44 using adhesive layer 50. The method further includes securing heat sink 44 in thermal contact with integrated circuit package 42 to extract heat during the operation of integrated circuit package 42. This method works particularly well with highly compliant, high performance non-adhesive materials, such as metal-based phase change materials, because thermal interface material 46 fills in any gaps that might have been introduced by the peripheral adhesive layer 50. In an alternative embodiment illustrated in FIG. 6, the method includes applying thermal interface material 46 to spreader 49 instead of heat sink 44.

Another example embodiment is directed to a kit of parts that form a heat sink assembly which is used to conduct thermal energy from an electronic device such as integrated circuit package 42. The kit may include one or more heat sinks 44 that are adapted to be thermally coupled to the electronic device, and at least one thermal interface material 46 that is adapted to be mounted to the heat sink 44 to improve thermal conductivity between heat sink 44 and the electronic device. Thermal interface material 46 includes an adhesive layer 50 on only a periphery of a surface 51 on thermal interface material 46.

Alternative materials may be used for the heat sink 44 and thermal interface material 46. The choice of materials will depend on the relevant heat transfer considerations and the costs that are associated with fabricating the electronic device.

Assembling an electronic assembly using a kit of parts as described herein allows electronic assemblies that include a variety of industry standard integrated circuit packages to be assembled from a single kit. The electronic assembly is fabricated by selecting the appropriate components based on the space available and the particular thermal situation.

Figure 7:
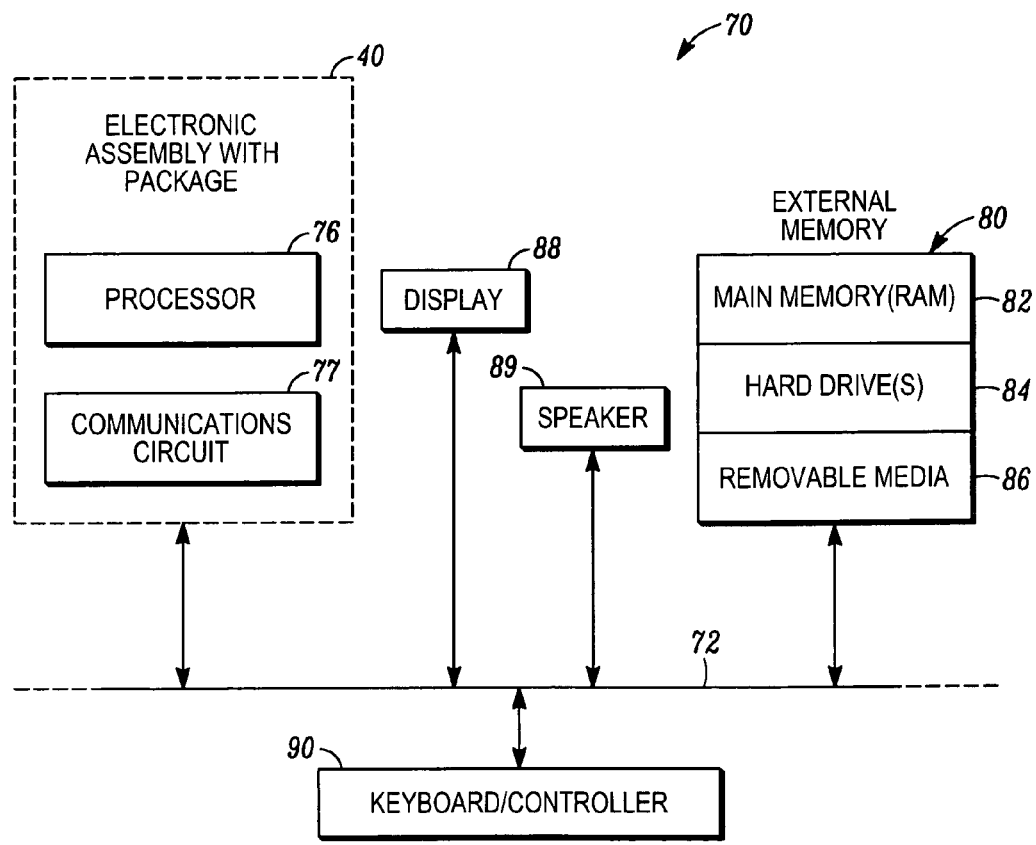
FIG. 7 is a block diagram of an electronic system incorporating at least one electronic assembly in accordance with an example embodiment the present invention.

FIG. 7 is a block diagram of an electronic system 70 incorporating at least one electronic assembly, such as electronic assembly 40 shown in FIG. 3. Electronic system 70 may be a computer system that includes a system bus 72 to electrically couple the various components of electronic system 70 together. System bus 72 may be a single bus or any combination of busses.

Electronic assembly 40 is coupled to system bus 72 and may include any circuit, or combination of circuits. In one embodiment, electronic assembly 40 includes a processor 76 which can be of any type. As used herein, processor means any type of circuit such as, but not limited to, a microprocessor, a microcontroller, a graphics processor or a digital signal processor.

Other types of circuits that can be included in electronic assembly 40 are a custom circuit or an application-specific integrated circuit, such as communications circuit 77 for use in wireless devices such as cellular telephones, pagers, portable computers, two-way radios, and similar electronic systems.

The electronic system 70 may also include an external memory 80 that in turn includes one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

As shown herein, the present invention can be implemented in a number of different embodiments, including an electronic package, an electronic system, a computer system, one or more methods of fabricating an electronic package, and one or more methods of fabricating an electronic assembly that includes the package. The elements, materials, geometries, dimensions, and sequence of operations can all be varied to suit particular packaging requirements.

FIGS. 1–7 are merely representational and are not drawn to scale. Certain proportions thereof may be exaggerated, especially as to adhesive layers 51, 62, while others may be minimized.

The heat sink assembly, kit and method described above provide a universally applied thermal solution for high heat generating electronic devices. The universal applicability provides thermal engineers with a cost-effective option for cooling parts of an electronic assembly. Many other embodiments will be apparent to those of skill in the art upon reviewing the above description. The scope of the invention should be determined with reference to the appended claims along with the full scope of equivalents to which such claims are entitled.

What is claimed is:

1. A method of securing a heat sink to an electronic device, comprising:
    applying a first adhesive layer to only a periphery of a first surface on a thermal interface material;
    applying a second adhesive layer to only a periphery of a second surface on a thermal interface material;
    applying the first surface of the thermal interface material to a heat sink using the first adhesive layer; and
    applying the second surface of the thermal interface material to the electronic device using the second adhesive layer.

2. The method of claim 1, wherein applying a first adhesive layer to only a periphery of a first surface on a thermal interface material includes aligning the first adhesive layer with an edge of the first surface, and applying a second adhesive layer to only a periphery of a second surface on a thermal interface material includes aligning the second adhesive layer with an edge of the second surface.

3. The method of claim 2, wherein applying a first adhesive layer to only a periphery of a first surface on a thermal interface material includes aligning the first adhesive layer with opposing edges of the first surface, and applying a second adhesive layer to only a periphery of a second surface on a thermal interface material includes aligning the second adhesive layer with opposing edges of the second surface.

4. The method of claim 1, wherein applying a first adhesive layer to only a periphery of a first surface on a thermal interface material includes aligning the first adhesive layer with each edge of the first surface, and applying a second adhesive layer to only a periphery of a second surface on a thermal interface material includes aligning the second adhesive layer with each edge of the second surface.

5. A heat sink assembly to extract thermal energy from an electronic device, the heat sink assembly comprising:
    a heat sink;
    a thermal interface material; and
    a first adhesive layer applied only to a periphery of a first surface on the thermal interface material to secure the first surface of the thermal interface material to the heat sink; and
    a second adhesive layer applied only to a periphery of a second surface on the thermal interface material.

6. The heat sink assembly of claim 5, wherein the first adhesive layer is aligned with an edge of the first surface, and the second adhesive layer is aligned with an edge of the second surface.

7. The heat sink assembly of claim 5, wherein the first adhesive layer is aligned with opposing edges of the first surface, and the second adhesive layer is aligned with opposing edges of the second surface.

8. The heat sink assembly of claim 5, wherein the first adhesive layer is aligned with each edge of the first surface, and the second adhesive layer is aligned with each edge of the second surface.

9. An electronic assembly comprising:
    an integrated circuit package; and
    a heat sink assembly including a heat sink and a thermal interface material, the thermal interface material including a first adhesive layer only on a periphery of a first surface on the thermal interface material such that the first adhesive layer secures the thermal interface material to the heat sink, the thermal interface material further including a second adhesive layer only on a periphery of a second surface on the thermal interface material such that the second adhesive layer secures the thermal interface material to the integrated circuit package.

10. The electronic assembly of claim 9, wherein the first adhesive layer is aligned with an edge of the first surface, and the second adhesive layer is aligned with an edge of the second surface.

11. The electronic assembly of claim 9, wherein the first adhesive layer is aligned with opposing edges of the first surface, and the second adhesive layer is aligned with opposing edges of the second surface.

12. The electronic assembly of claim 9, wherein the first adhesive layer is aligned with each edge of the first surface, and the second adhesive layer is aligned with each edge of the second surface.

13. The electronic assembly of claim 9, wherein the integrated circuit package includes a heat spreader such that the second adhesive layer secures the thermal interface material to the heat spreader.

14. A computer system comprising:
    a bus;
    a random access memory electrically coupled to the bus;
    a processor secured to an integrated circuit package that is electrically connected to the bus; and
    a heat sink assembly including a heat sink and a thermal interface material, the thermal interface material including a first adhesive layer only on a periphery of a first surface on the thermal interface material such that the first adhesive layer secures the thermal interface material to the heat sink, the thermal interface material further including a second adhesive layer only on a periphery of a second surface on the thermal interface material such that the second adhesive layer secures the thermal interface material to the integrated circuit package.

15. The computer system of claim 14, wherein the first adhesive layer is aligned with each edge of the first surface, and the second adhesive layer is aligned with each edge of the second surface.

16. The computer system of claim 14, wherein the integrated circuit package includes a heat spreader and the second adhesive layer secures the thermal interface material to the heat spreader.

17. A kit of parts to form a heat sink assembly that is used to cool an electronic device, the kit comprising:

a heat sink to be thermally coupled to the electronic device to conduct thermal energy away from the electronic device; and a thermal interface material to be mounted to the heat sink to promote thermal conductivity between the heat sink and the electronic device, the thermal interface material including a first adhesive layer that is applied only to a periphery of a first surface on the thermal interface material and a second adhesive layer that is applied only to a periphery of a second surface on the thermal interface material.

18. The kit of claim 17, wherein the first adhesive layer is aligned with an edge of the first surface, and the second adhesive layer is aligned with an edge of the second surface.

19. The kit of claim 17, wherein the first adhesive layer is aligned with each edge of the first surface, and the second adhesive layer is aligned with each edge of the second surface.

* * * * *